(12) United States Patent
Kwon et al.

(10) Patent No.: US 9,935,095 B2
(45) Date of Patent: Apr. 3, 2018

(54) REMOVING STATIC ELECTRICITY FROM A DISPLAY DEVICE

(71) Applicant: SAMSUNG DISPLAY CO., LTD., Yongin-si, Gyeonggi-Do (KR)

(72) Inventors: So Ra Kwon, Cheonan-si (KR); Jin Suk Park, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/130,233

(22) Filed: Apr. 15, 2016

(65) Prior Publication Data
US 2017/0025446 A1 Jan. 26, 2017

(30) Foreign Application Priority Data

Jul. 24, 2015 (KR) .................. 10-2015-0105256

(51) Int. Cl.
H01L 27/20 (2006.01)
H01L 27/12 (2006.01)
(Continued)

(52) U.S. Cl.
CPC ........ H01L 27/0248 (2013.01); G02F 1/1345 (2013.01); G02F 1/13452 (2013.01); H01L 23/60 (2013.01); H01L 27/0292 (2013.01); H01L 27/1248 (2013.01); H01L 27/3223 (2013.01); H01L 27/3276 (2013.01);
(Continued)

(58) Field of Classification Search
CPC ............... H01L 27/124; H01L 27/1244; H01L 27/3276; H01L 27/3279; H01L 27/3297; H01L 27/3223; H01L 27/0248; H01L 27/0292; H01L 23/60; H01L 23/5286; G02F 1/136286; G02F 2001/136295; G02F 2001/13629
See application file for complete search history.

(56) References Cited

U.S. PATENT DOCUMENTS 6,411,351 B1 * 6/2002 Zhang ................. G02F 1/13454
257/E27.111
2004/0189188 A1 * 9/2004 Fan ......................... H01L 27/12
313/504
(Continued)

FOREIGN PATENT DOCUMENTS

KR 1020050032280 4/2005
KR 1020080107776 12/2008
KR 1020140066831 6/2014

Primary Examiner — Kevin Parendo
(74) Attorney, Agent, or Firm — F. Chau & Associates, LLC

(57) ABSTRACT

A display device may include a substrate, a display area, a peripheral region, a driving circuit and a dummy wire. A display area formed on a side of the substrate and in which a plurality of pixels are provided. A peripheral region surrounds the display area. A driving circuit provided in the peripheral region, which provides a driving voltage to the plurality of pixels and includes a driving voltage terminal for receiving the driving voltage. A dummy wire portion provided in the peripheral region, separated from the display area with the driving circuit therebetween, and includes a plurality of dummy wires. The driving voltage terminal of the driving circuit is connected to at least one of the plurality of dummy wires.

6 Claims, 6 Drawing Sheets

(51) Int. Cl.
  *H01L 27/32*   (2006.01)
  *H01L 23/60*   (2006.01)
  *G02F 1/1345*  (2006.01)
  *G02F 1/1362*  (2006.01)
  *H01L 27/02*   (2006.01)

(52) U.S. Cl.
  CPC .... *H01L 27/3297* (2013.01); *G02F 1/136286* (2013.01); *G02F 2001/13629* (2013.01); *G02F 2001/136272* (2013.01); *G02F 2001/136295* (2013.01)

(56) References Cited

U.S. PATENT DOCUMENTS

| | | | |
|---|---|---|---|
| 2007/0272983 A1* | 11/2007 | Liao | G02F 1/136204 257/359 |
| 2008/0117558 A1* | 5/2008 | Shih | G02F 1/136204 361/117 |
| 2013/0069853 A1* | 3/2013 | Choi | H01L 27/3276 345/80 |
| 2014/0210807 A1* | 7/2014 | Kim | H01L 27/0266 345/212 |
| 2015/0001500 A1* | 1/2015 | Sung | H01L 51/52 257/40 |
| 2016/0064465 A1* | 3/2016 | Oh | H01L 27/3262 257/43 |
| 2016/0291430 A1* | 10/2016 | Sun | G02F 1/136204 |

* cited by examiner

REMOVING STATIC ELECTRICITY FROM A DISPLAY DEVICE

CROSS-REFERENCE TO RELATED APPLICATION

This application claims priority to and the benefit of Korean Patent Application No. 10-2015-0105256 filed in the Korean Intellectual Property Office on Jul. 24, 2015, the entire contents of which are incorporated by reference herein.

TECHNICAL FIELD

The present invention relates to a display device.

DISCUSSION OF RELATED ART

Flat panel displays may include a liquid crystal display or an organic light emitting device.

A liquid crystal display generally includes an upper panel on which a common electrode and a color filter are formed, a lower panel on which a thin film transistor and a pixel electrode are formed, and a liquid crystal layer provided between the upper and lower panels. When a potential difference is applied to the pixel electrode and the common electrode, an electric field is applied to the liquid crystal layer, and the orientation of the liquid crystal molecules are controlled by the electric field. Transmittance of incident light is determined by a disposal direction of liquid crystal molecules, and thus a desired image may be displayed by controlling the potential difference between the electrodes.

An organic light emitting device (OLED) includes a hole injecting electrode (anode), an electron injecting electrode (cathode), and an organic emission layer formed therebetween. OLEDs are self-emissive display devices in which the holes injected by the anode and the electrons injected by the cathode are recombined in the organic emission layer to emit light.

SUMMARY

According to an exemplary embodiment of the present invention, a display device may include a substrate, a display area, a peripheral region, a driving circuit and a dummy wire. A display area formed on the substrate and including a plurality of pixels. A peripheral region surrounds the display area. A driving circuit formed in the peripheral region, which provides a driving voltage to the plurality of pixels and includes a driving voltage terminal for receiving the driving voltage. A dummy wire portion formed in the peripheral region and includes a plurality of dummy wires. The driving circuit is between the display area and the dummy wire portion. The driving voltage terminal of the driving circuit is connected to at least one of the plurality of dummy wires.

In an exemplary embodiment, the driving voltage terminal may include a terminal body and a plurality of protrusions. The terminal body is connected to the plurality of pixels. The terminal body is connected to the plurality of protrusions protruding toward the dummy wire portion from the terminal body, and the protrusions may be connected to the dummy wire.

In an exemplary embodiment, an extending length of one of the protrusions may be different from an extending length of a neighboring protrusion.

In an exemplary embodiment, width of one of the protrusions may be different from a width of a neighboring protrusion.

In an exemplary embodiment, a distance between one of the protrusions and a neighboring protrusion may be smaller than a width of a protrusion.

In an exemplary embodiment, ends of the plurality of protrusions opposite the terminal body may be round.

In an exemplary embodiment, the display device may further include a passivation layer for covering a part of the display area and the peripheral region, wherein the passivation layer may be made of a polyimide material and may cover the driving voltage terminal, except for the plurality of protrusions.

In an exemplary embodiment, the dummy wire portion may further include a wire insulating layer for covering the dummy wire. The driving voltage terminal may be electrically connected to the dummy wire through a contact hole passing through the wire insulating layer.

In an exemplary embodiment, one of the driving voltage terminals may be connected to the dummy wire through a pair of the contact holes.

In an exemplary embodiment, the dummy wire portion may further include a ground terminal which provides a ground voltage and which is connected to the plurality of dummy wires.

According to an exemplary embodiment, a display device may include a display area, a peripheral area, a driving voltage terminal, a plurality of protrusions and a plurality of dummy wires. A display area includes a plurality of pixels. A peripheral area surrounds the display area and includes a driving voltage terminal and a plurality of dummy wires. The driving voltage terminal is connected to the plurality of pixels and includes a plurality of protrusions. The plurality of protrusions extends from the driving voltage terminal towards the plurality of dummy wires and each protrusion connects to one of the plurality of dummy wires. The driving voltage terminal is between the display area and the plurality of dummy wires.

In an exemplary embodiment, a passivation layer covers part of the display area and extends to include the peripheral area except for a plurality of protrusions. The passivation layer may be formed with a polyimide material.

In an exemplary embodiment, the plurality of dummy wires is surrounded by a wire insulating layer. Each protrusion connects to one of the plurality of dummy wires through a contact hole in the wire insulating layer.

In an exemplary embodiment, the plurality of dummy wires is connected to a ground electrode provided on the lower side of the substrate.

In an exemplary embodiment, ends of the plurality of protrusions opposite the terminal body are round.

DETAILED DESCRIPTION

Figure 1:
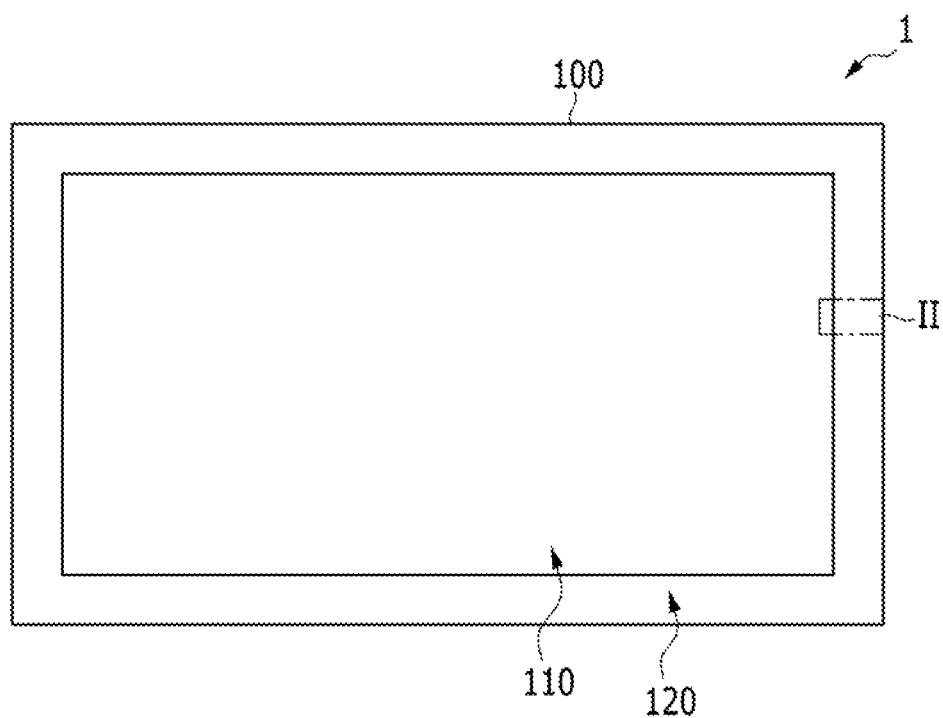
FIG. 1 shows a display device according to an exemplary embodiment of the present invention.

Embodiments of the present invention will be described more fully hereinafter with reference to the accompanying drawings. As those skilled in the art would realize, the described embodiments may be modified in various different ways, all without departing from the spirit or scope of the present invention.

Parts that are unrelated to the description of the exemplary embodiments are not shown in order to make the description clear, and like reference numerals designate like element throughout the specification.

The size and thickness of each component illustrated in the drawings are illustrated in the drawings for better understanding and ease of description, but embodiments of the present invention are not limited to the illustrations. In the drawings, the thicknesses of layers, films, panels, regions, etc., are exaggerated for clarity. The thicknesses of the layers, films, panels, regions, etc., are enlarged in the drawings for better understanding and ease of description.

In addition, unless explicitly described to the contrary, the word "comprise" and variations such as "comprises" or "comprising" will be understood to imply the inclusion of stated elements but not the exclusion of any other elements. When it is said that any part, such as a layer, film, region, or plate, is positioned on another part, it means the part is directly on the other part or above the other part with at least one intermediate part. An upper part of a target portion indicates an upper part or a lower part of the target portion, and it does not mean that the target portion is always positioned at the upper side based on a gravitational direction.

Further, the term "in a plane view" means the case of viewing the object portion from the top, and the term "in a cross-sectional view" means the case of viewing a cross-section taken by vertically cutting the object portion from the side.

A display device according to an exemplary embodiment of the present invention will now be described with reference to the accompanying drawings.

Figure 2:
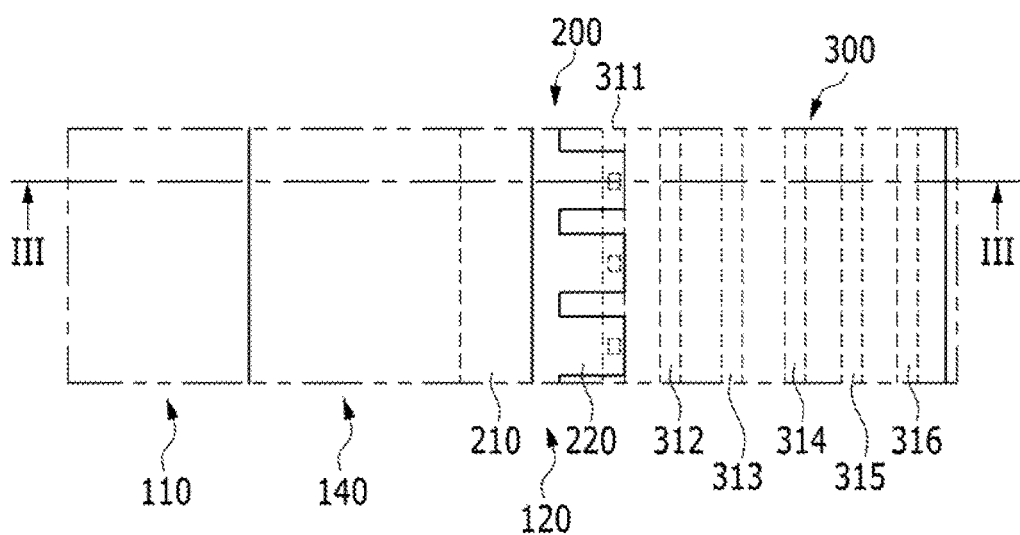
FIG. 2 shows a magnified portion of II of FIG. 1.
Figure 3:
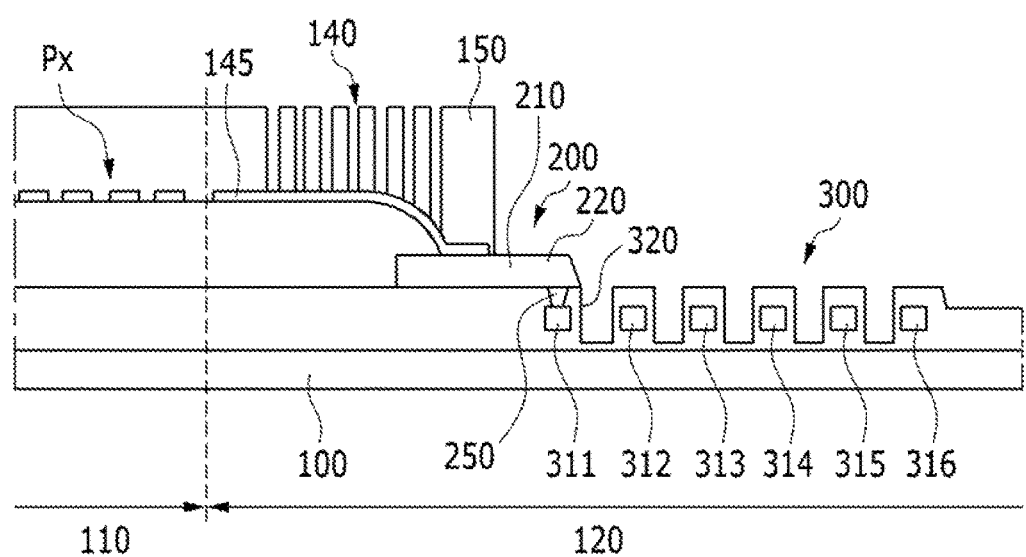
FIG. 3 shows a cross-sectional view with respect to line III of FIG. 2.

FIG. 1 shows a display device according to an exemplary embodiment of the present invention and FIG. 2 shows a magnified portion of II of FIG. 1. FIG. 3 shows a cross-sectional view with respect to line III of FIG. 2.

Referring to FIG. 1 to FIG. 3, the display device 1 includes a substrate 100, a display area 110 formed on a side of the substrate 100, and a peripheral region 120 surrounding the display area 110.

The substrate 100 may be formed from a soft material such as polyimide, polyethylene terephthalate, polyethylene naphthalate (PEN), poly carbonate, or polyether sulfone (PES), or a brittle material such as glass. The above-noted material of the substrate 100 is exemplary, thus the substrate 100 of the display device 1 according to an exemplary embodiment of the present invention is not limited thereto.

The display area 110 includes a plurality of pixels for displaying an image, and the pixels may exemplarily be organic light emitting diodes (OLED) and may include hole injecting electrodes, electron injecting electrodes, and organic emission layers formed therebetween.

The peripheral region 120 surrounds the display area 110 and is provided near an edge of the substrate 100.

A driving circuit 140 for applying a driving voltage to the pixel, which includes a driving voltage terminal 200 and a dummy wire portion 300 separated from the display area 110 with the driving circuit 140 therebetween, as well as a plurality of dummy wires (311-316) in the peripheral region 120. Embodiments of the invention may contain more than one dummy wire in the dummy wire portion 300.

The driving voltage is applied to a driving voltage terminal 200 of the driving circuit 140, and the driving voltage terminal 200 includes a terminal body 210 and a plurality of protrusions 220.

The terminal body 210 is connected to pixels (Px) of the display area 110 through a terminal wire 145. The terminal body 210 applies the driving voltage to the pixel (Px) to drive the pixels (Px).

A plurality of protrusions 220 protruding toward a dummy wire portion 300 are formed on a first side of the terminal body 210, and the protrusion 220 is connected to at least one of a plurality of dummy wires (311-316) of the dummy wire portion 300.

The terminal body 210 may wrap around the display area 110 with a plurality of protrusions 220 extended out from around the terminal body 210. The plurality of dummy wires (311-316) of the dummy wire portion 300 may also wrap around the display area 110. The plurality of protrusions 220 may extend to the plurality of dummy wires (311-316) of the dummy wire portion 300.

The terminal body 210 may extend in a direction to a lower side of the substrate 100 from an upper side thereof, and the protrusion 220 may be formed to cross a direction in which the terminal body 210 extends. The dummy wire portion 300 includes a first dummy wire 311 to a sixth dummy wire 316, and a wire insulating layer 320 for covering the first dummy wire 311 to the sixth dummy wire 316.

The first dummy wire 311 to the sixth dummy wire 316 may be formed to extend in a direction toward a lower side of the substrate 100 from an upper side thereof. The first dummy wire 311 to the sixth dummy wire 316 may be connected to a ground electrode 170 (refer to FIG. 4) provided on the lower side of the substrate 100. The first dummy wire 311 to the sixth dummy wire 316 receive a ground voltage from the ground electrode 170.

A protrusion 220 of the driving voltage terminal 200 is exemplarily connected to a first dummy wire 311 from among a plurality of dummy wires (311-316).

An end of the protrusion 220 is provided on an upper side of the first dummy wire 311, and a wire insulating layer 320 is provided between the protrusion 220 and the first dummy wire 311.

The protrusion 220 may be electrically connected to the first dummy wire 311 through a contact hole 250 passing through the wire insulating layer 320.

Therefore, when undesired static electricity is applied to the driving voltage terminal 200, the static electricity may not be applied to the pixel (Px), but to the ground electrode 170 through the first dummy wire 311, thereby improving an electrostatic discharge (ESD) of the display device 1.

In this case, neighboring protrusions 220 are separated from each other by a predetermined distance. For example, the distance between the neighboring protrusions 220 may be less than a width of one protrusion 220. A thickness of the protrusion 220 may be formed to provide sufficient strength to cross the gap between each dummy wire of the plurality of dummy wires (311-316).

The display device 1 may further include a passivation layer 150 for protecting the pixel (Px) provided in the display area 110 and the driving circuit 140 provided in the peripheral area 120 by covering part of the display area 110 and the peripheral area 120.

The passivation layer 150 may be formed with a polyimide material, and covers the driving voltage terminal 200, except for a plurality of protrusions 220.

In an exemplary embodiment, the protrusion 220 of the driving voltage terminal 200 is connected to the first dummy wire 311, and it may also be possible for the protrusion 220 to be connected to a plurality of dummy wires from among the first dummy wire 311 to the sixth dummy wire 316.

Figure 4:
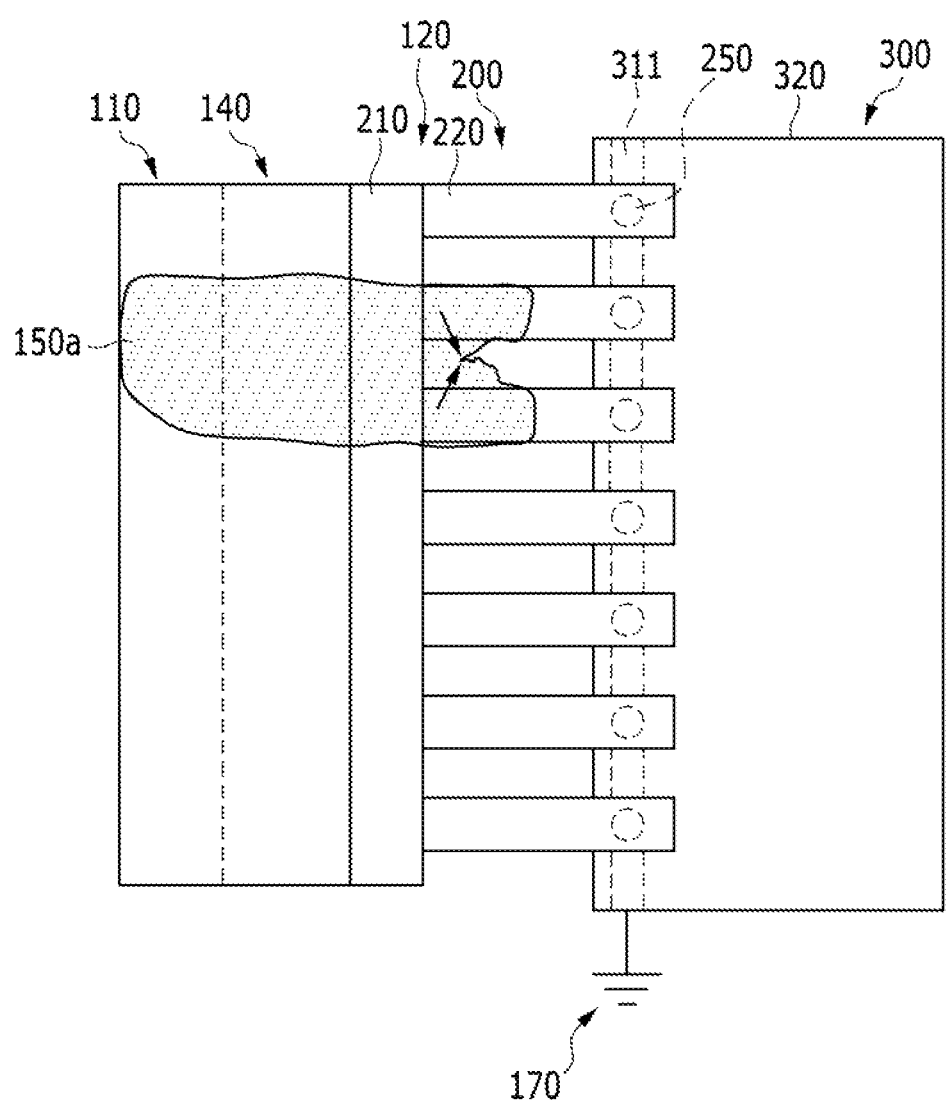
FIG. 4 shows a process for forming a passivation layer of a display device of FIG. 1.

FIG. 4 shows a process for forming a passivation layer of a display device of FIG. 1.

Referring to FIG. 4, regarding the display device 1 according to the present exemplary embodiment, a coated layer 150a formed of a polyimide material is applied to the display area 110 and the peripheral area 120, and the applied coated layer 150a is patterned to form a passivation layer 150. Here, when the coated layer 150a is applied from the peripheral area 120 to the display area 110. The coated layer 150a permeates among the protrusions 220 of the driving voltage terminal 200 provided in the peripheral area 120 so that the coated layer 150a may be applied in a uniform manner.

When the application of the coated layer 150a is finished, the applied coated layer 150a is patterned to form a passivation layer 150 covering part of the display area 110 and the peripheral region 120.

Figure 5:
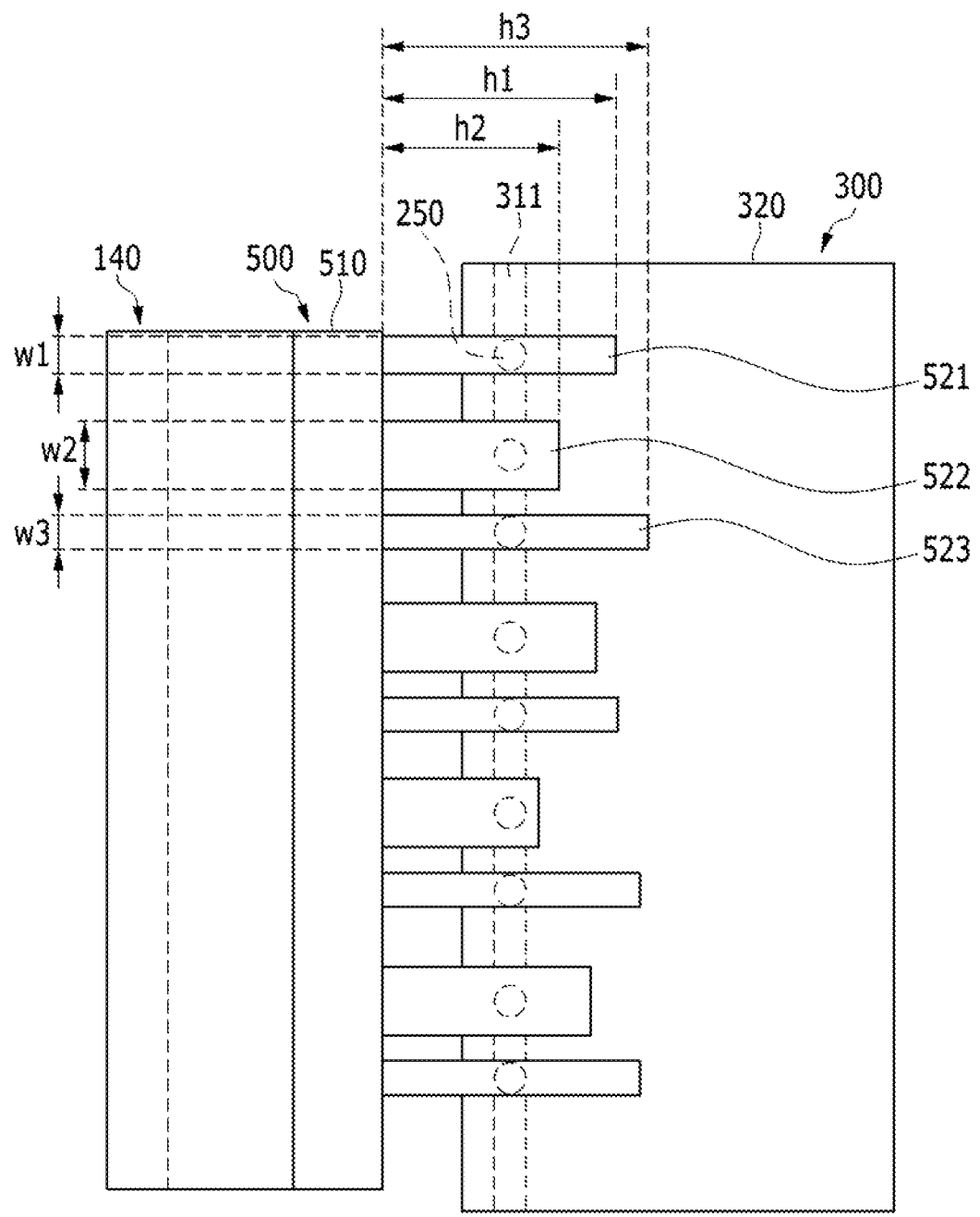
FIG. 5 shows part of a display device according to another exemplary embodiment of the present invention.

FIG. 5 shows part of a display device according to another exemplary embodiment of the present invention.

The present exemplary embodiment has a different configuration of the driving voltage terminal, and other configurations thereof substantially correspond to the display device described with reference to FIG. 1 to FIG. 4, and thus a featured portion of the present exemplary embodiment will now be described.

Referring to FIG. 5, a power supply terminal 500 of a display device according to the present exemplary embodiment includes a terminal body 510, a first protrusion 521, a second protrusion 522, and a third protrusion 523.

The first protrusion 521 to the third protrusion 523 are connected to a first dummy wire 311 of the dummy wire portion 300, and the first dummy wire 311 is covered by the wire insulating layer 320.

Each of the first protrusion 521 to the third protrusion 523 are electrically connected to the first dummy wire 311 through one or more contact holes passing through the wire insulating layer 320. For example, the first protrusion 521 is electrically connected to the first dummy wire 311 through the contact hole 250 passing through the wire insulating layer 320.

The first protrusion 521 to the third protrusion 523 are provided in a direction toward the lower side of the substrate 100 from the upper side thereof, and may be configured to have different widths or lengths.

In detail, the first protrusion 521 is formed to protrude toward the dummy wire portion 300 from the terminal body 510 by a first length h1, and the width of the first protrusion 521 has a first width w1.

The second protrusion 522 and the third protrusion 523 are formed to respectively protrude with a second length h2 and a third length h3 and have a second width w2 and a third width w3.

The first length h1 of the first protrusion 521 of the display device 1 according to the present exemplary embodiment may be formed to be greater than the second length h2 of the second protrusion 522 and less than the third length h3 of the third protrusion 523.

The first width w1 of the first protrusion 521 may be formed to be greater than the second width w2 of the second protrusion 522 and less than the third width w3 of the third protrusion 523.

The thickness and/or the length of one of a plurality of protrusions 521, 522, and 523 are formed to be different from the thickness and/or the width of the neighboring protrusion.

Figure 6:
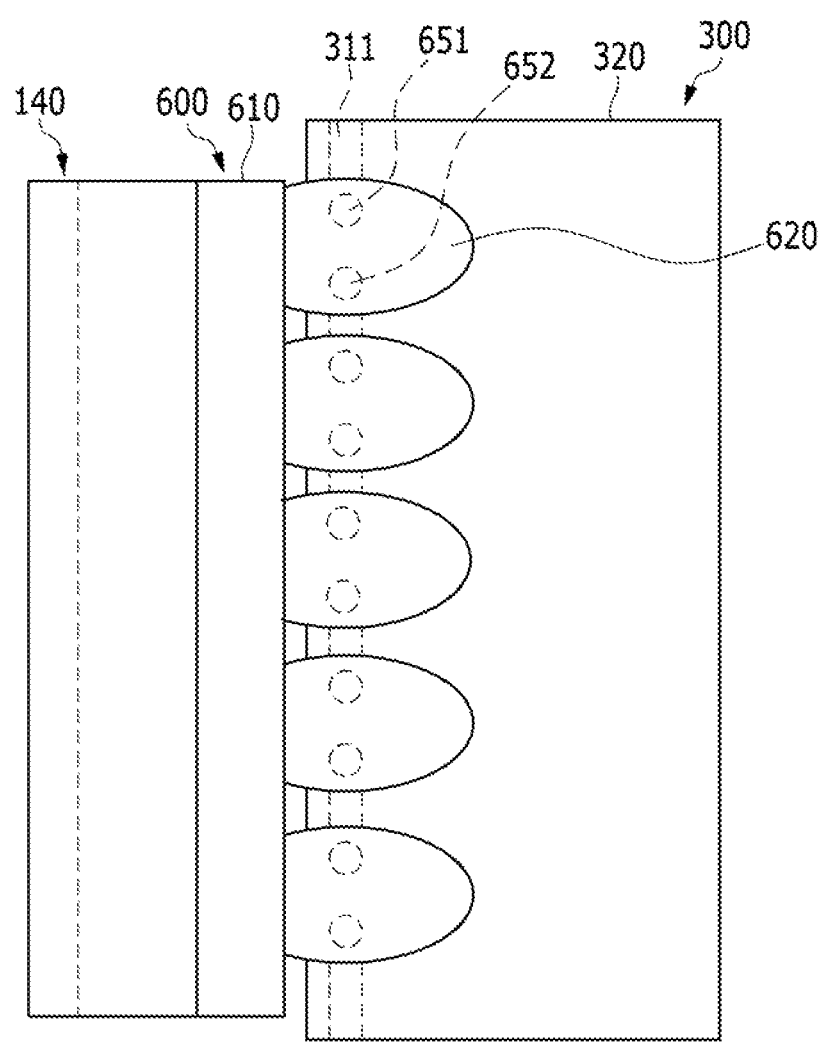
FIG. 6 shows part of a display device according to another exemplary embodiment of the present invention.

FIG. 6 shows part of a display device according to an exemplary embodiment of the present invention.

The present exemplary embodiment has a different configuration of the power supply terminal, and since the other configurations substantially correspond to the display device described with reference to FIG. 1 to FIG. 4, the present exemplary embodiment will now be described focusing on the characteristic part.

Referring to FIG. 6, a power supply terminal 600 of the display device according to the present exemplary embodiment includes a terminal body 610 and a plurality of protrusions 620 with round ends.

A single protrusion 620 is electrically connected to the first dummy wire 311 by a pair of contact holes 651 and 652 passing through the wire insulating layer 320.

The first contact hole 651 and the second contact hole 652 are connected to the same protrusion 620, and are separated from each other along the length of the first dummy wire 311.

While embodiments of this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a display area formed on the substrate and including a plurality of pixels;
   a peripheral region surrounding the display area;
   a driving circuit formed in the peripheral region, providing a driving voltage to the plurality of pixels, and including a driving voltage terminal for receiving the driving voltage; and
   a wire portion formed in the peripheral region and including a plurality of wires, wherein each of the wires is connected to a ground terminal that provides a ground voltage each of the wires is extended lengthwise in a first direction,
   wherein the driving circuit is between the display area and the wire portion,
   wherein the driving voltage terminal includes:
   a terminal body connected to the plurality of pixels; and
   a plurality of protrusions protruding toward the wire portion from the terminal body,
   wherein each of the protrusions is extended lengthwise in a second direction substantially perpendicular to the first direction, each of the protrusions overlaps a first wire of the plurality of wires, and each of the protrusions is connected to the first wire via a contact hole to connect the driving voltage terminal to the first wire, and wherein each of the protrusions is spaced apart from each other.

2. The display device of claim 1, further comprising
a passivation layer for covering a part of the display area and the peripheral region,
wherein the passivation layer is made of a polyimide material and covers the driving voltage terminal, except for the plurality of protrusions.

3. The display device of claim 1, wherein
the wire portion further includes a wire insulating layer for covering the plurality of wires, and
the driving voltage terminal is electrically connected to the plurality of wires through the contact holes passing through the wire insulating layer.

4. The display device of claim 3, wherein
each of the plurality of protrusions is connected to one of the plurality of wires through a pair of the contact holes.

5. The display device of claim 1, wherein the plurality of wires are separated by gaps.

6. The display device of claim 5, wherein the gaps are formed in a wire insulating layer.

* * * * *